Figure 1:
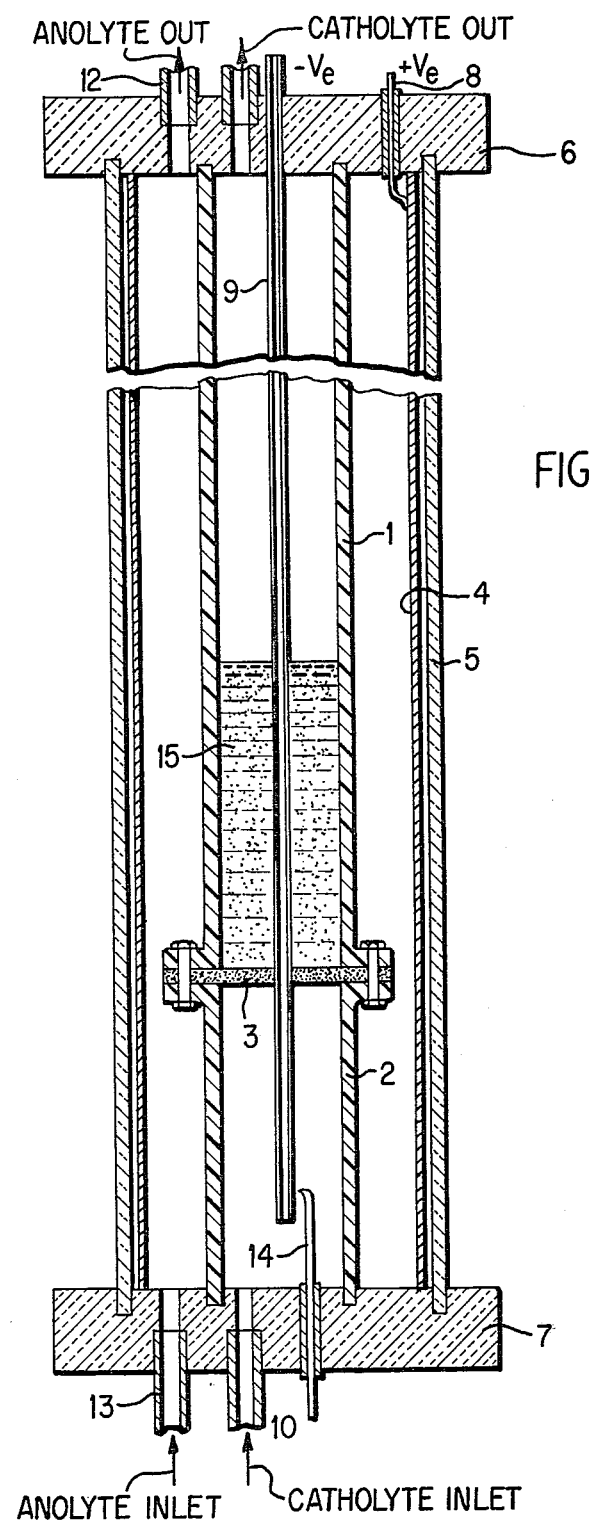

United States Patent [19]

Backhurst et al.

[11] 4,236,991

[45] Dec. 2, 1980

[54] ELECTROCHEMICAL CELLS

[75] Inventors: John R. Backhurst, Allendale; Martin Fleischmann, Chandlersford; Francis Goodridge; Raymond E. Plimley, both of Newcastle-upon-Tyne, all of England

[73] Assignee: National Research Development Corporation, London, England

[21] Appl. No.: 57,368

[22] Filed: Jul. 13, 1979

Related U.S. Application Data

[60] Division of Ser. No. 828,431, Aug. 29, 1977, which is a continuation of Ser. No. 288,387, Sep. 12, 1972, abandoned, which is a continuation-in-part of Ser. No. 24,195, Mar. 31, 1970, which is a continuation-in-part of Ser. No. 639,803, May 19, 1967.

[30] Foreign Application Priority Data

May 24, 1966 [GB] United Kingdom ............... 23070/66

[51] Int. Cl.³ ............................................. C25B 9/00
[52] U.S. Cl. .................................... 204/272; 204/275
[58] Field of Search ..................... 204/54 R, 272, 275, 204/283, 286

[56] References Cited

U.S. PATENT DOCUMENTS 4,118,292  10/1978  Fray et al. ............................. 204/67

Primary Examiner—Howard S. Williams
Attorney, Agent, or Firm—Oblon, Fisher, Spivak, McClelland & Maier

[57] ABSTRACT

An extended surface area electrode for an electrochemical cell is provided by causing a bed of conducting particles to be expanded in the form of a fluidized bed by controlled upward flow of electrolyte through an electrode chamber containing current-carrying conducting means which makes contact with the fluidized bed.

2 Claims, 2 Drawing Figures

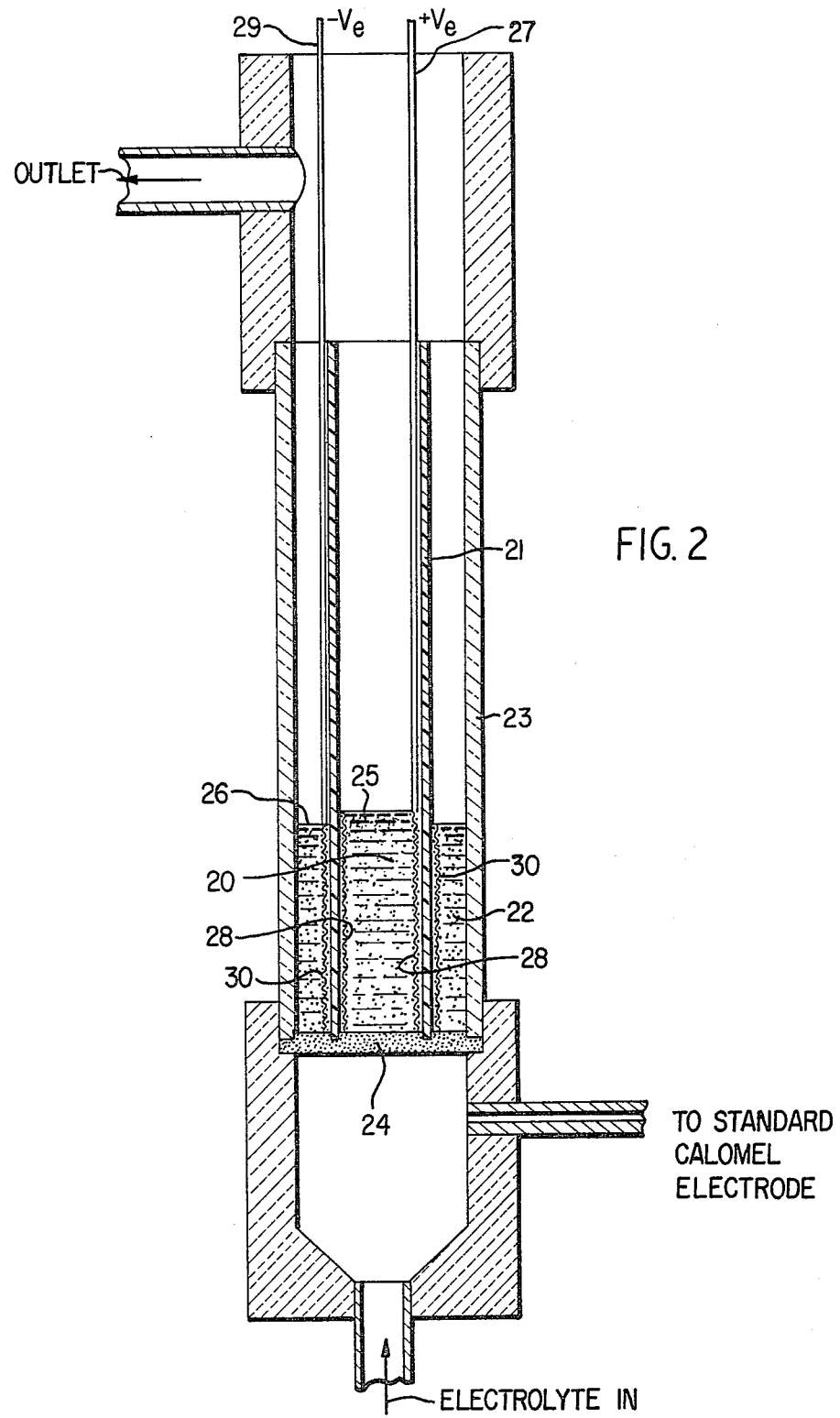

ELECTROCHEMICAL CELLS

This is a division of application Ser. No. 828,431 filed Aug. 29, 1977, which in turn is a continuation of application Ser. No. 288,387, filed Sept. 12, 1972, now abandoned which in turn is a continuation-in-part application of application Ser. No. 24,175, filed Mar. 31, 1970, which in turn is a continuation-in-part of application Ser. No. 639,803, filed May 19, 1967.

This invention relates to extended surface area electrode arrangements for use in connection with electrochemical reactions.

As in most chemical reactions depending upon a surface effect, the reactivity of an electrochemical cell is dependent upon the active area of the surface at which the reaction takes place, that is to say, the larger the active surface area of an electrode per unit volume of an electrochemical cell, the higher the current that can be supported by a given volume of cell. Many proposals have been made for increasing the active area of a solid type of electrode; thus it has been proposed, for example, to provide an electrode in the form of an electronic conductor with a surface which is activated by being made highly foraminous either by treatment of the conductor surface, such as by selective removal of metal according to a Raney process, or by use of particulate materials made adherent to the conductor surface; another proposal has been to provide an electrode prepared by compaction of particulate materials to form a porous electronic conductor.

Although not the sole objective, it is one objective of the present invention to provide an electrode arrangement which is suitable for cells in which electrochemical reactions in the liquid state are required to be carried out in continuous flow. For such cells, the known activated solid type of electrode is very inefficient for reactions which occur at low rates, and, even with the maximum enhancement of active area that has been achieved with this type of electrode, the cell efficiency has not been as high as desirable. Moreover such electrodes are susceptible to temperature differences across the active surface.

Another known type of electrode, use of which might be thought to overcome some of these disadvantages, is one in which a mass of electronically conducting material and/or semi-conducting material in particulate form is packed into a pervious electrode memberpieces, chunks and pellets have been proposed in this context, as well as small particles. In a cell making use of such an electrode, it is usual to provide a permeable, or semi-permeable, membrane between this electrode and an electrode of opposite polarity in order to avert contact between the particulate material and the other electrode. While electrodes of considerable surface area can be provided in this way, the difference in performance from that of the solid type of electrode is not always satisfactory since in practical configurations only a small fraction of the particles may be active due to the markedly non-uniform electrode potential distribution.

Still further proposals have been made in the past to provide electrode arrangements in which particles of conducting or semi-conducting material are caused to flow either constantly or intermittently through an electrode chamber so that the particles may be changed or replenished in the electrode during use. Thus it is known to provide a slurry or sludge type of electrode in which particles in constant contact with each other are rendered mobile by means of a fluid, normally electrolyte, and the slurry or sludge is constantly or intermittently circulated through the electrode chamber.

In the case of the slurry type of electrode for a fuel cell, yet another proposal has been made to cause streams of electrolyte with finely divided catalytic particles suspended therein to be circulated in the cell in such a way that the particles loaded with fuel or oxidising agent are brought into contact with an electrode surface in the electrode compartment.

Slurry and sludge type electrodes suffer from the disadvantage that both particles and electrolyte have to be circulated and therefore, in common with the circulating particle type, pose pumping problems, particularly as regards the particles, as well as difficulties associated with electrode potential distributions.

The present invention provides a means of enabling an electrochemical cell to be operated with either or each electrode behaving as an improved extended area electrode.

Thus in accordance with an aspect of the invention, a method of providing an electrode for an electrochemical cell comprises providing a mass of discrete particulate material in an electrode chamber containing current-carrying means, said material being at least one member of the group consisting of (a) conducting material and (b) non-conducting material coated with conducting material, and arranging for a liquid electrolyte to flow through said chamber under control upwardly through said mass so as to cause the particles to be levitated and thereby to form a fluidised bed of particles within the chamber with said current-carrying means in contact therewith, whereby said fluidised bed forms an extended area electrode for said cell.

According to another aspect of the invention, in the process of operating an electrochemical cell in which a reaction occurs involving passage of ions through an electrolyte between at least one anode and at least one cathode, an improvement comprises:

(a) providing in the cell for one said electrode a vertically elongated columnar zone containing current-carrying means, (b) providing in said zone a mass of discrete particulate material, said material being at least one member from the group consisting of (1) conducting material and (2) non-conducting material coated with conducting material, (c) forming said mass of discrete particulate material into a fluidised bed of particles within said zone and in contact with said current-carrying means by controlled substantially uniformly distributed upward flow of liquid electrolyte through said zone, said fluidised bed of particles providing an extended area of surface for the electrode, and (d) providing a membrane which is at least ion semi-permeable between said fluidised bed electrode and the other electrode with electrolyte between said other electrode and said membrane.

An improved process of operating an electrochemical cell according to this latter manner involves providing for both an anode and a cathode to comprise fluidised bed electrodes.

In operation, in a fluidised bed electrode as proposed according to the invention, the upward velocity of the liquid electrolyte, which is arranged to be substantially uniform on a horizontal plane through the electrode chamber or zone is adjusted so that each particle is levitated by a drag effect of the electrolyte with the result that the bed or mass of particles expands upwardly while still retaining its form in that its upper surface is still discernible and substantially in a horizontal plane. The volume occupied by the expanded bed of particles is therefore greater than the volume of the bed or mass of particles when static. This volume can be adjusted over a range depending upon the size of the chamber or zone and upon the sizes of the particles. If the rate of flow of the liquid electrolyte is raised to too high a value then the particles will be swept out of the electrode chamber or zone and the fluidised bed electrode will have been destroyed; care is therefore necessary to ensure that this does not happen unless intentionally, possibly to remove the particles from the chamber or zone so that a fresh mass or bed of particles can be introduced to reform the electrode.

The fluidised bed electrode provides considerable improvement because the particles are in a state of fairly vigorous motion against each other and/or against the current carrying means. If a potential is applied between the current carrying means and the other electrode of the cell, then it can be arranged that the particles can be charged and discharged in rapid succession. Also by adjustment of the flow it is possible to adjust the electrode potential of the electrode to optimum performance. Such measure of control is not possible with the trapped particle type of electrode, nor with the circulating slurry or sludge type of electrode.

For certain reactions, the particles forming the bed may be such as to participate in the electrochemical reaction to be performed by the cell and the size and/or size distribution of the particles may be chosen to give optimum results. The particles may be wholly of conducting material, possibly of composite conducting materials or each or some of the particles may comprise a core, for example of glass or of a plastics material, coated partially or completely with conducting material, or materials. The particles of an electrode operating in accordance with the invention will normally be fluidised by passage therethrough of liquid electrolyte alone but the fluidisation may be effected by a fluid or fluids in addition to the electrolyte, for example one or more reactants.

Preferably the electrode arrangement is adapted to operate in conjunction with one or more current-conducting members extending thereinto but it may be found, for particular uses, that the currentconducting member(s) may form a boundary surface, or boundary surfaces, or part of a boundary surface, of the electrode.

In accordance with another aspect of the invention an electrode arrangement for an electrochemical cell comprises at least one electrode chamber having a porous base, said chamber having a space beneath said porous base and containing a layer of discrete particulate solids above said base, said solids being at least one member of the group consisting of (a) conducting particles and (b) non-conducting particles coated with conducting material, means for introducing liquid electrolyte to the space beneath said porous base and causing said electrolyte to flow through said base, the base being arranged to cause electrolyte flow through said layer of particles to be substantially uniform, means to control said flow so as to cause the particles to be levitated, such that the layer is expanded to form and maintain a fluidised bed of said particles within said chamber, and at least one current-carrying member extending into said chamber to contact said fluidised bed, whereby said fluidised bed forms an extended area electrode for the cell. Thus the particles as discrete solids will each be capable of bearing an electrical charge and they are fluidised by flow of the electrolyte including the reactant, or one or more of the reactants if, for example, there is a multiplicity of reactants.

The charge-transferring particles may be of any suitable material(s), such as of metals or alloys, or of mixtures of metals and/or alloys or of non-metals coated with metals and/or alloys. They will normally be in the form of powders and if the powder is comprised of particles of substantially spherical shape, control of fluidisation can be more effective.

The invention is particularly applicable to electrodes for use with an electrochemical cell comprising a membrane separating an anolyte from a catholyte; if the membrane forms a barrier that is of closed cross-section, the particles of the electrode may be positioned within the zone bounded by the membrane and the fluidisation of the particles may then be effected by flow of the catholyte, or the anolyte, through this zone. Alternatively, the boundary walls of the fluidised electrode may include part of the cell containing-wall and/or the current conducting members and may, for certain purposes, be used without a membrane.

It should be noted that an electrode according to the invention is distinguished completely from one in which, as has already been proposed, solid metal or semi-conducting particles form a sludge or slurry which have to be passed through the cell with a liquid reactant. It has been found that a fluidised bed electrode has considerable and unexpected advantage over the circulating particle type of electrode in which the particles are circulated past a current-carrying member.

In order that the invention may be better understood, one form of electrochemical cell embodying the invention will now be described with reference to the accompanying diagrammatic drawings of which:

FIG. 1 shows a form of electrochemical cell in which the cathode is of fluidised bed form and, FIG. 2 illustrates a cell having both anode and cathode of fluidised bed form.

Referring now to FIG. 1, the cell comprises a catholyte chamber formed by two flanged tubes 1 and 2 joined end to end with a porous plate 3 between them. The tubes and flanges are of a porous plastics material known under the trade name "VYON" and manufactured by Porous Plastics Limited and the tubes are 1 in. diam., with a wall thickness of 0.1 in. The pore size may be limited by availability of material to about 50 microns, but other materials of different pore size may of course be chosen to suit any particular circumstances. Preferably the pore size is not greater than the size of particles of the powder referred to below which is introduced into the assembly. The plate 3 is of "VYON" sheet, 1/16th in. thick and having about the same average pore size.

A cylindrical jacket 4 of lead is arranged to line a 2 in. diam. glass cylindrical envelope 5 and the envelope 5, together with the inner tube assembly 1, 2 has end plates 6,7 forming liquid-tight joints with both the envelope and the inner tube assembly.

The end plate 6 carries a terminal 8 connected to the lead liner 4, which forms an anode for the cell, and a copper rod conductor 9 of ⅛th in. diam. passes both the end plate 6 and the plate 3, terminating near the bottom of the cell. An inlet tube 10 for the catholyte is provided in the end plate 7. Tubes 12 and 13 are provided in the end plates 6 and 7 respectively to cater for flow of anolyte through the annulus formed between the envelope 5 and the inner tube assembly. The flow of anolyte may be in contra-flow to that of catholyte. The tube 1 serves as an ion-permeable membrane.

A probe 14 from a reference electrode passes through the end plate 7 and is located close to the conductor 9 below the porous plate 3.

In accordance with the invention a quantity of powder, for example copper powder of size range 63 to 150 microns, preferably of a narrow range, such as 63 to 75 microns, 75 to 90 microns or 125 to 150 microns, is contained within the inner tube assembly 1,2 so as, when static, to rest on the porous plate 3, and this powder is caused to provide a fluidised bed by flow of catholyte through the porous plate 3. The depiction of the fluidised bed of particles in FIG. 1, although diagrammatic, illustrates the form of such a bed with its top surface still discernible in spite of the expansion of the static mass of particles.

Alternatively, the powder may comprise copper plated or metallised glass or polystyrene or other suitable plastics spheres and the sizes of these may be greater for similar flow because their densities are lower. Glass or plastics spheres may be produced of very uniform size and are readily available over a large range of sizes, while solid metal and plated, or metalized, glass particles of any of these size ranges are probably suitable, although larger sizes may of course be used if desirable and practical, it may be necessary in the case of particles with covers of plastics material to select particles of larger sizes or to make certain that the plastics materials of which they are composed is of higher enough density and/or that there is sufficient thickness of metal present as coating. This is to avoid working with composite particles which have overall densities so close to the density of the fluidising liquid that the movement of the particles when in the form of the fluidised bed is sluggish and not vigorous enough. Sluggish movement will affect the performance of the electrodes.

For a given weight of particles in the bed it will be evident that the height of the bed for a given geometry is dependent upon the flow rate of the electrolyte and on the size of the particles. Both particle size and bed height may require optimisation for any particular size of cell and of the electrolyte composition.

The principle of operation of such a cell is not yet fully understood, but it has been found, for example, that the fluidised bed electrode of the dimensions given will easily sustain a current of 1 amp./cm.$^3$ of the bed. It is possible that the particles of powder in the fluidised bed are charged as they come into contact with the central conductor 9 which is maintained at a suitable potential difference relative to a reference electrode and that these charged particles then are discharged when contacted by the reactant ions or molecules in the catholyte, or by contact with other particles, the effect of the fine division of the electrode material being to extend the active area of the cathode.

It has been noted, from observations of the performance of the cell illustrated in FIG. 1 for the cathodic reduction of m-nitrobenzene sulphonic acid to metanilic acid at room temperature, that for the same degree of expansion of the beds, solid copper spheres in the two ranges 75 to 90 microns and 125 to 150 microns sustain approximately the same potential-current characteristics, that is between 9 and 10 amps. at a potential relative to a standard calomel electrode of about 0.70 volt. For the same bed height and potential, but using copper plated polystyrene spheres in the range of 355 to 420 microns, the current sustained is about 52 amps.

In terms of current densities, that is milli-amps per sq.cm., the solid copper spheres in the two ranges mentioned immediately above, yield a figure of about 500–590 per unit area of the outside of the bed—that is about 20 sq.cm. for the 1 inch height; for the copper coated polystyrene spheres of 355 to 420 microns the equivalent figure is over 3000.

Another type of cell is shown diagrammatically in FIG. 2, both the anode and the cathode of the cell being comprised of fluidised beds of particles. Here the anode 20 is arranged within a cylindrical diaphragm 21 of the porous "VYON" material, the internal diameter being about ¾ in. and the wall thickness 0.1 in. Surrounding the diaphragm is a cathode 22 of annular form contained within the glass cylinder 23. The anode particles, for example platinum powder, will be formed into a fluidised bed of a desired height by electrolyte entering through the porous base 24; a typical position of the top of the anode fluidised bed is indicated at 25. Similarly a typical position of the top of the annular cathode fluidised bed is indicated at 26; this latter may be of copper particles, or indeed of any particles such as described above. The material of the particles for anode and cathode will, however, probably depend upon the reaction that is required to be carried out in the cell.

The anode current feed is shown at 27 and terminates at a cylindrical gauze 28; the cathode current feed 29 terminates at a concentric cylindrical gauze 30. These gauzes are, as near as is practicable, concentric with the diaphragm 21.

This symmetrical arrangement appears to be advantageous so as to ensure that the current density in the cell is reasonably uniform. However, if the current distribution in the cell can be controlled to ensure that excessively high local currents do not build up in parts of the electrodes, then the need for symmetry of the electrodes is not so great.

The invention is applicable to cells for other types of reaction than those described above involving straightforward liquid electrolytes. Thus it is applicable to cells for use with reactants introduced in gaseous form together with liquid electrolyte. Also it is applicable in cases where the reaction requires the electrolyte to be non-aqueous. In some cases an ion semi-permeable membrane may be preferred to separate the anode and cathode chambers.

An electrode operation according to the invention may be used for any reactor provided that at least some part of the reaction required to take place is by electrochemical oxidation and/or reduction, or involves a reaction wherein there may be a switch from reduction to oxidation or vice versa at the electrode or any reaction which in part involves an electron transfer. Materials used in or composing the electrode fluidised bed may or may not be consumed during the reaction. It will be seen that arrangements can be made for replacement of some or all of the particles in the bed without dismantling the cell and, if necessary, without destroying the form of the bed.

The invention has application to use in fuel cells wherein electric current may be drawn from a cell as a result of the electrochemical reaction in the cell, e.g. consumption of the particle material.

Although in the particular reactor that has been described above the electrode material remains in situ, in certain reactions it may be necessary or desirable to circulate the fluidised bed, that is by taking off some of the particles while replacing them with others, particularly where the particles enter into the reaction and are consumed or increased in size. This enables the extracted reacting particles, for instance, to be replenished by fresh particles or by particles which have been subjected to a reconstituting process.

It is to be understood that the scope of the invention embraces electrodes for use in batch type as well as in continuous or semicontinuous reactors. In the latter types of reactor it is desirable that there should be some form of automatic control and a means of achieving such control may be made readily available in cells in accordance with the invention by use of a probe such as the reference probe 14 in the cell described with reference to the accompanying drawing. Use of a reference potential taken off the reactor through such probe, enables a control of the conditions in the body of the electrode to be effected, as by a straightforward feedback system through, for instance, a potentiostat; by this means the electrode potential in the cell may be arranged to be kept constant or, if necessary, to follow some predetermined variable pattern. Such control systems will be evident to those skilled in the art.

In those forms of cell utilizing a fluidised bed electrode in accordance with the invention it will be observed that the flowing fluid can be used to control heat dissipation of the electrode and of any diaphragm, if present. By arranging for continuous or intermittent circulatory flow through a suitable means, a useful heat exchange process can be introduced. However, in some forms of electrode, heat control will be inherent through the mere introduction of cool fluid for fluidisation purposes.

It is to be understood that we do not rule out the possibility at this stage of additional agitation of the electrode material being effected by mechanical movement, for instance movement of the conductor extending into the electrode material or by some other mechanical means additional to this conductor. For this purpose, the agitating means could conceivably be a smooth rod which may have attachments that cause such additional agitation which may be effected in a liquid or even in the presence of both liquid and gas.

It is to be understood that the form of the conductor to be adopted for the cell may be any as found to be most suitable for the particular type of cell. Thus rod conductors with metal gauze attachments and other surface extending forms have been tried. It is clear, however, that these additions to the conductor should not interfere appreciably with the flow conditions of the mobile solids in the electrode.

To summarize, the advantages over a conventional cell that can be achieved, either singly or in combination, by a cell operating with a fluidised bed electrode in accordance with the invention, can be briefly stated as follows:

(a) Large surface area can be contained in a small volume of electrode.
(b) Simplicity of construction.
(c) Ease of addition or removal of heat.
(d) Ease of scale up in size.
(e) Ease of renewal or replacement of electrode material.
(f) Can provide continuous operation.
(g) Can easily be adapted to high pressure operation when gases are involved.

We claim:

1. An electrode arrangement for an electrochemical cell comprising at least one electrode chamber having a porous base, said chamber having a space beneath said porous base and containing a layer of discrete particulate solids above said base, said solids being at least one member of the group consisting of (a) conducting particles and (b) non-conducting particles coated with conducting material, means for introducing liquid electrolyte to the space beneath said porous base and causing said electrolyte to flow through said base, the base being arranged to cause electrolyte flow through said layer of particles to be substantially uniform, means to control said flow so as to cause the particles to be levitated, such that the layer is expanded to form and maintain a fluidised bed of said particles within said chamber, and at least one current-carrying member extending into said chamber to contact said fluidised bed, whereby said fluidised bed forms an extended area electrode for the cell.

2. An electrode arrangement for an electrochemical cell comprising at least one vertically elongated electrode chamber having a porous base, said chamber having a space beneath said porous base, a bed of solid plastics particles having metal plated upon their surfaces, said bed of particles having as lower limit said porous base and being contained within said chamber, means for introducing liquid electrolyte to said space below said porous base and causing said electrolyte to flow through said base and upwards through said bed, the base being of such porosity as to ensure that the electrolyte flow through said bed is substantially uniform over horizontal planes therethrough, whereby said particles are caused to form a fluidised bed within said chamber, and at least one metal conductor extending within said chamber to make contact with said fluidised bed when formed, said fluidised bed constituting an extended area electrode for said cell.

* * * * *

UNITED STATES PATENT AND TRADEMARK OFFICE
CERTIFICATE OF CORRECTION

PATENT NO. : 4,236,991  Page 1 of 2
DATED : December 2, 1980
INVENTOR(S) : JOHN BACKHURST ET AL It is certified that error appears in the above—identified patent and that said Letters Patent is hereby corrected as shown below:

Please correct the Related U.S. Application Data to read as follows:

[60]--Related U.S. Application Data

Division of Ser. No. 828,431, Aug. 29, 1977, which is a continuation of Ser. No. 288,387, Sep. 12, 1972, abandoned, which is a continuation-in-part of Ser. No. 24,175, March 31, 1970, which is a continuation-in-part of Ser. No. 639,803, May 19, 1967.

--Rather than--

UNITED STATES PATENT AND TRADEMARK OFFICE
CERTIFICATE OF CORRECTION

PATENT NO. : 4,236,991   Page 2 of 2
DATED      : December 2, 1980
INVENTOR(S) : JOHN BACKHURST ET AL It is certified that error appears in the above—identified patent and that said Letters Patent is hereby corrected as shown below:

[60]--Related U.S. Application Data

Division of Ser. No. 828,431, Aug. 29, 1977, which is a continuation of Ser. No. 288,387, Sep. 12, 1972, abandoned, which is a continuation-in-part of Ser. No.

24,195, March 31, 1970, which is a continuation-in-part of Ser. No. 639,803, May 19, 1967, as it now appears.

*Signed and Sealed this*

*Nineteenth* Day of *May 1981*

[SEAL]

*Attest:*

RENE D. TEGTMEYER

*Attesting Officer*    *Acting Commissioner of Patents and Trademarks*